(12) United States Patent
Aboudina et al.

(10) Patent No.: US 10,735,017 B2
(45) Date of Patent: Aug. 4, 2020

(54) EFFICIENT SUCCESSIVE APPROXIMATION REGISTER ANALOG TO DIGITAL CONVERTER

(71) Applicant: GOODIX TECHNOLOGY INC., San Diego, CA (US)

(72) Inventors: Mohamed Aboudina, San Diego, CA (US); Ali Farid, San Diego, CA (US); Ahmed Emira, San Diego, CA (US); Hassan Elwan, San Diego, CA (US)

(73) Assignee: GOODIX TECHNOLOGY INC., San Diego ( * ) Notice: Subject to any disclaimer, the term of this patent is extended or adjusted under 35 U.S.C. 154(b) by 0 days.

(21) Appl. No.: 15/993,612

(22) Filed: May 31, 2018

(65) Prior Publication Data

US 2019/0372582 A1 Dec. 5, 2019

(51) Int. Cl.
*H03M 1/46* (2006.01)
(52) U.S. Cl.
CPC ............ *H03M 1/462* (2013.01); *H03M 1/466* (2013.01)
(58) Field of Classification Search
None
See application file for complete search history.

(56) References Cited

U.S. PATENT DOCUMENTS

| 8,766,833 B1 * | 7/2014 | Bogner | H03M 1/46 341/120 |
| 9,774,337 B1 | 9/2017 | Chao et al. | |

| 2011/0057823 A1 | 3/2011 | Harpe | |
| 2015/0263744 A1 * | 9/2015 | Sharma | H03M 1/0678 341/118 |

(Continued)

FOREIGN PATENT DOCUMENTS

| CN | 104506195 A | 4/2015 |
| CN | 104716961 A | 6/2015 |
| CN | 105391451 A | 3/2016 |

OTHER PUBLICATIONS

Liu, Jian-Feng et al.; Design and Simulation of a 12-bit, 40 MSPS asynchronous SAR ADC for the readout of PMT signal; Cornell University, Jan. 2016, URL: https://arxiv.org/abs/1601.03549 (Year: 2016).*

(Continued)

*Primary Examiner* — Howard Williams
(74) *Attorney, Agent, or Firm* — Kilpatrick Townsend & Stockton LLP

(57) ABSTRACT

A successive approximation register (SAR) analog to digital converter (ADC) is disclosed. The SAR ADC includes: a DAC, configured to receive an analog input voltage and a digital input word, and to generate a first voltage. The SAR ADC also includes a comparator, configured to generate a second voltage based on the first voltage and a reference voltage. The second voltage has a value corresponding with a sign of the difference between the first voltage and the reference voltage. The SAR ADC also includes an SAR logic circuit configured to receive the second voltage from the comparator, and to generate the digital input word for the DAC. The SAR logic is further configured to generate a digital output word representing the value of the analog input voltage, where the digital output word of the SAR logic has a greater number of bits than the digital input word of the DAC.

20 Claims, 3 Drawing Sheets

(56) References Cited

U.S. PATENT DOCUMENTS

| | | | |
|---|---|---|---|
| 2015/0263756 A1* | 9/2015 | Chiu | H03M 1/468 |
| | | | 341/118 |
| 2016/0056831 A1 | 2/2016 | Park et al. | |
| 2016/0134300 A1* | 5/2016 | Wang | H03M 1/0854 |
| | | | 341/172 |
| 2019/0140654 A1* | 5/2019 | Huang | H03M 1/1071 |

OTHER PUBLICATIONS

Machine translation of CN105391451 cited in IDS (Year: 2015).*
International Search Report dated Mar. 6, 2019 in the corresponding CN application (applcation No. PCT/CN2018/113985).
European Search Report dated Mar. 20, 2020 in the corresponding EP application(application No. 18826161.4).
Chung-Yi Li et al., "A 10-Bit Area-Efficient SAR ADC with Re-usable Capacitive Array", 5 pages.
X. Y. Tong et al., "Low-energy and area-efficient switching scheme for SAR AID converter", 5 pages.

* cited by examiner

EFFICIENT SUCCESSIVE APPROXIMATION REGISTER ANALOG TO DIGITAL CONVERTER

FIELD OF THE INVENTION

The present invention relates generally to a successive approximation register (SAR) analog to digital converter (ADC), and more particularly to a SAR ADC which has a digital to analog converter (DAC) which has fewer bits of resolution than the SAR ADC.

BACKGROUND OF THE INVENTION

Conventional SAR ADC architectures use a DAC which has the same resolution or number of bits which is equal to the resolution or number of bits of the SAR ADC. Accordingly, the DAC uses significant power, is physically large, and is difficult to manufacture with good matching.

BRIEF SUMMARY OF THE INVENTION

Another inventive aspect is a successive approximation register (SAR) analog to digital converter (ADC), including a DAC, configured to receive an analog input voltage and a digital input word, and to generate a first voltage based on the analog input voltage and the digital word. The SAR ADC also includes a comparator, configured to receive the first voltage and a reference voltage, and to generate a second voltage based on the first voltage and on the reference voltage, where the second voltage has a value corresponding with a sign of the difference between the first voltage and the reference voltage, and an SAR logic circuit configured to receive the second voltage from the comparator, and to generate the digital input word for the DAC based on one or more second voltages received from the comparator. The SAR logic is further configured to generate a digital output word based on a plurality of second voltages received from the comparator, the digital output word represents the value of the analog input voltage, and the digital output word of the SAR logic has a greater number of bits than the digital input word of the DAC.

In some embodiments, the SAR logic is configured to determine the MSB of the digital output word by comparing the analog input voltage with the reference voltage, to determine a digital representation of a difference between the analog input voltage and the reference voltage, and to generate the bits of the digital output word other than the MSB based on the digital representation of the difference between the analog input voltage and the reference voltage.

In some embodiments, the voltage corresponding with an lsb of the DAC is substantially equal to the voltage corresponding with an lsb of the SAR ADC.

In some embodiments, the SAR logic is configured to determine whether the digital input word causes the DAC to generate the first voltage such that the first voltage is greater than or is less than the analog input voltage based on whether the analog input voltage is determined to be less than or greater than the reference voltage by the comparator.

In some embodiments, the SAR logic is configured to generate the digital input word to cause the DAC to generate the first voltage such that the first voltage is greater than the analog input voltage in response to the analog input voltage being less than the reference voltage.

In some embodiments, the SAR logic is configured to generate the digital input word to cause the DAC to generate the first voltage such that the first voltage is less than the analog input voltage in response to the analog input voltage being greater than the reference voltage.

In some embodiments, the SAR logic is configured to determine a digital representation of a difference between the analog input voltage and the reference voltage.

In some embodiments, the SAR logic is configured to determine the digital representation with a linear search.

In some embodiments, the SAR logic is configured to determine the digital representation with a binary search.

In some embodiments, the digital output word represents the value of the analog input voltage with reference to a range of analog values bounded by a minimum input voltage and a maximum input voltage, where a difference between the minimum input voltage on the maximum input voltage is substantially equal to two times a difference between reference voltage and the minimum input voltage.

Another inventive aspect is a method of determining a digital output word having a value corresponding with an analog input value with a successive approximation register (SAR) analog to digital converter (ADC). The method includes, with a DAC of the SAR ADC receiving an analog input voltage and a digital input word, and generating a first voltage based on the analog input voltage and the digital word. The method also includes, with a comparator of the SAR ADC receiving the first voltage and a reference voltage, and generating a second voltage based on the first voltage and on the reference voltage, where the second voltage has a value corresponding with a sign of the difference between the first voltage and the reference voltage. The method also includes, with an SAR logic circuit of the SAR ADC receiving the second voltage from the comparator, generating the digital input word for the DAC based on one or more second voltages received from the comparator, and generating a digital output word based on a plurality of second voltages received from the comparator, where the digital output word represents the value of the analog input voltage, and where the digital output word has a greater number of bits than the digital input word of the DAC.

In some embodiments, the method further includes, with the SAR logic, determining the MSB of the digital output word by comparing the analog input voltage with the reference voltage, determining a digital representation of a difference between the analog input voltage and the reference voltage, and generating the bits of the digital output word other than the MSB based on the digital representation of the difference between the analog input voltage and the reference voltage.

In some embodiments, the voltage corresponding with an lsb of the DAC is substantially equal to the voltage corresponding with an lsb of the SAR ADC.

In some embodiments, the method further includes, with the SAR logic, determining whether the digital input word causes the DAC to generate the first voltage such that the first voltage is greater than or is less than the analog input voltage based on whether the analog input voltage is determined to be less than or greater than the reference voltage by the comparator.

In some embodiments, the method further includes, with the SAR logic, generating the digital input word to cause the DAC to generate the first voltage such that the first voltage is greater than the analog input voltage in response to the analog input voltage being less than the reference voltage.

In some embodiments, the method further includes, with the SAR logic, generating the digital input word to cause the DAC to generate the first voltage such that the first voltage is less than the analog input voltage in response to the analog input voltage being greater than the reference voltage.

In some embodiments, the method further includes, with the SAR logic, determining a digital representation of a difference between the analog input voltage and the reference voltage.

In some embodiments, the method further includes, with the SAR logic, determining the digital representation with a linear search.

In some embodiments, the method further includes, with the SAR logic, determining the digital representation with a binary search.

In some embodiments, the digital output word represents the value of the analog input voltage with reference to a range of analog values bounded by a minimum input voltage and a maximum input voltage, where a difference between the minimum input voltage on the maximum input voltage is substantially equal to two times a difference between reference voltage and the minimum input voltage.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The present invention is related to an SAR ADC. The SAR ADC determines a corresponding digital value for an analog input based on a successive approximation system. A particular embodiment of the SAR ADC is designed to generate digital values for analogue inputs ranging between a minimum input value and a maximum input value. As discussed in further detail below, the successive approximation system uses a reference voltage value to generate the digital values. In the embodiments discussed, the reference voltage is approximately or substantially equal to 1 half the difference between the maximum input value and the minimum input value.

Figure 1:
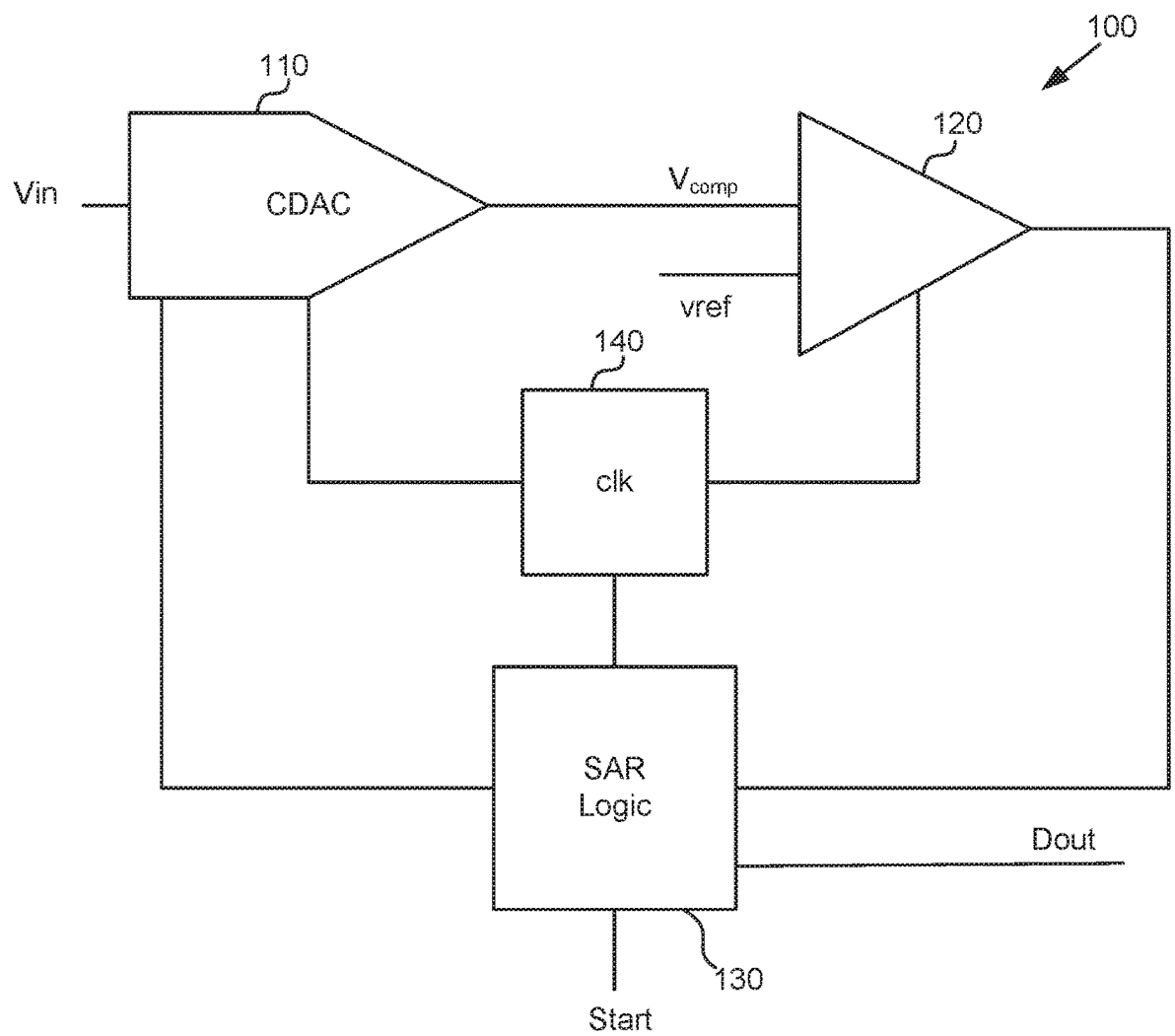
FIG. 1 is a schematic illustration of an SAR ADC according to one embodiment.

FIG. 1 is a schematic illustration of an SAR ADC 100 according to one embodiment. SAR ADC 100 includes CDAC 110, comparator 120, SAR logic 130 and clock generator 140.

SAR ADC 100 receives an analog input value at Vin. In response to a start signal, SAR ADC 100 calculates and generates a digital value corresponding with the analog input value Vin. Once calculated, SAR ADC 100 provides the digital value as output word Dout.

To determine the digital value, SAR ADC 100 determines a most significant bit (MSB), and subsequently determines each of the other bits of the digital output word. To determine the MSB, in response to one or more clock signals from clock generator 140, the analog input voltage Vin is provided to comparator 120 as voltage Vcomp, and comparator 120 compares voltage Vcomp with reference voltage Vref and generates an output voltage corresponding with the results of the comparison. In addition, in response to one or more clock signals from clock generator 140, SAR logic 130 receives the output from the comparator 120, and determines and stores an MSB based on the output from the comparator 120.

To determine each of the other bits of the digital output word, in response to each of one or more clock signals from clock generator 140, SAR logic 130 determines a next digital input word for CDAC 110, and CDAC 110 generates a next voltage Vcomp. In addition, in response to each of one or more clock signals from clock generator 140, comparator 120 compares the next voltage Vcomp with reference voltage Vref and generates an output voltage corresponding with the results of the comparison. Furthermore, in response to one or more clock signals from clock generator 140, SAR logic 130 receives the output from the comparator 120, and determines whether a next digital input word for CDAC 110 should be generated.

In some embodiments, in may be beneficial to determine whether the analog input voltage Vin is greater than or is less than the reference voltage Vref. In such embodiments, the comparison used to determine the MSB may be used as an indication of whether the analog input voltage Vin is greater than or is less than the reference voltage Vref.

In some embodiments, SAR logic 130 uses the information regarding whether the analog input voltage Vin is greater than or is less than the reference voltage Vref to determine a next digital input word for CDAC 110. For example, SAR logic 130 may use the information regarding whether the analog input voltage Vin is greater than or is less than the reference voltage Vref to determine whether each next Vcomp should be greater than the analog input voltage Vin or should be less than the analog input voltage Vin.

If sufficient digital input words for CDAC 110 have been generated and corresponding comparison results has been received by SAR logic 130, SAR logic 130 determines that the digital output word may be generated and provided to output Dout. If sufficient digital input words for CDAC 110 and corresponding comparison results has been received by SAR logic 130, SAR logic 130 generates a next digital input port for CDAC 110.

SAR logic 130 may include circuitry configured to implement any of a number of SAR calculations. For example, SAR logic 130 may include circuitry configured to implement either a linear or a binary SAR calculation, as understood by those of ordinary skill in the art. The circuitry of SAR logic 130 may be designed and built using processes known to those of skill in the art.

Figure 2:
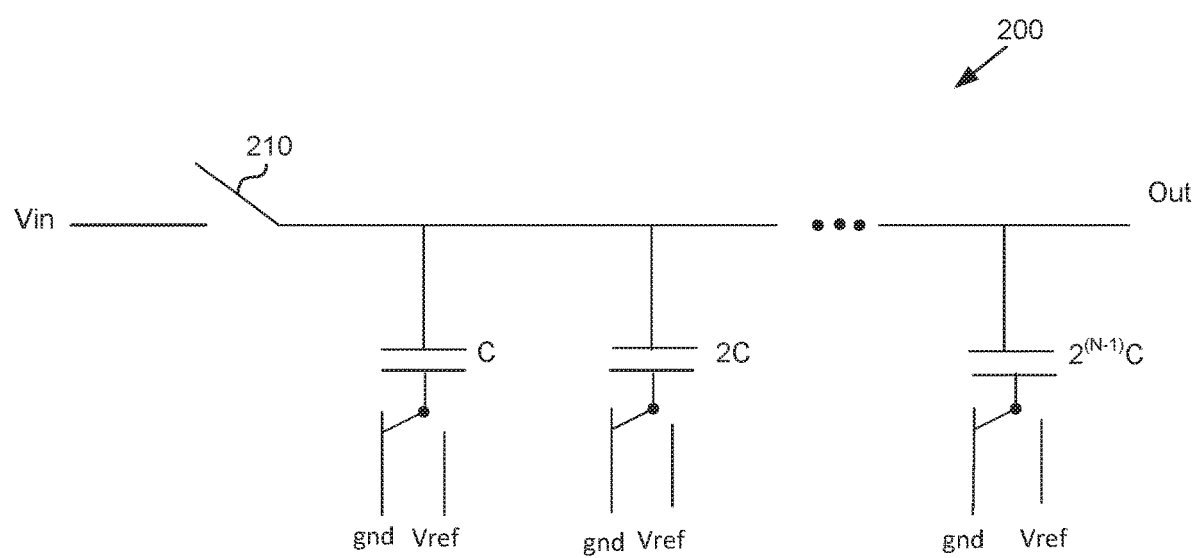
FIG. 2 is a schematic illustration of an embodiment of a CDAC which may be used in the SAR ADC of FIG. 1.

FIG. 2 is a schematic illustration of an embodiment of a CDAC 200 which may be used in the SAR ADC of FIG. 1. CDAC 200 includes switch 210 and an array of capacitors. The capacitors are by binarily waited, such that capacitors having values $C, 2\times C, 4\times C, \ldots 2^{(N-1)}\times C$ are included, where N is equal to the number of bits of resolution of CDAC 200. Each of the capacitors is connected to a switch configured to selectively connect the capacitor to either a ground voltage or a reference voltage Vref.

When used in the SAR ADC 100 illustrated in FIG. 1 to determine the MSB of the digital output word, switch 210 is closed such that the analog input voltage Vin is provided to comparator 120 as voltage Vcomp. In addition, while comparator 120 compares voltage Vcomp with reference voltage Vref, the switches connected to each of the capacitors are each connected to either the ground voltage or the reference voltage Vref, and are not changed during the comparison.

When used in the SAR ADC 100 illustrated in FIG. 1 to determine each of the other bits of the digital output word, during a first period, the output node out is charged to analog input voltage Vin through conducting switch 210 while the switches connected to each of the capacitors are each connected to either the ground voltage or the reference voltage Vref, and during a second period, switch 210 is opened and one or more of the switches are switched, such that the one or more capacitors connected to the one or more switches are then connected to the other of the ground voltage or the reference voltage.

For example, during the first period the output node may be charged to analog input voltage Vin through the switch 210, which is closed. Additionally, during the first period, the switch connected to the capacitor having weight C is connected to the ground voltage. Subsequently, during the second period, switch 210 is opened, and the switch connected to the capacitor having weight C is switched so as to be connected to the reference voltage Vref. As a result, the voltage at the output node out is increased from the analog input voltage Vin by an amount corresponding with the charge stored on the capacitor having weight C.

In some embodiments, CDAC 110 includes a sample and hold amplifier between the analog input and switch 210. When present, the sample and hold amplifier samples the analog input voltage Vin, stores the sample voltage, for example, using a capacitor, and drives the switch 210 with a voltage substantially equal to the stored voltage. Sample and hold amplifiers known to those of skill in the art may be used.

Similarly, in some embodiments, SAR ADC 100 may include a sample and hold amplifier between the analog input and CDAC 110. When present, the sample and hold amplifier samples the analog input voltage Vin, stores the sample voltage, for example, using a capacitor, and drives CDAC 110 with a voltage substantially equal to the stored voltage. Sample and hold amplifiers known to those of skill in the art may be used.

As another example, during the first period, the output node may be charged to analog input voltage Vin through the switch 210, which is closed. Additionally, during the first period, the switch connected to the capacitor having weight C is connected to the reference voltage Vref. Subsequently, during the second period, switch 210 is opened, and the switch connected to the capacitor having weight C is switched so as to be connected to the ground voltage. As a result, the voltage at the output node out is decreased from the analog input voltage Vin by an amount corresponding with the charge stored on the capacitor having weight C.

The voltage decrease may be equal to or substantially equal to 1 lsb of the SAR ADC. For example, if the SAR ADC has 10 bits of resolution, the voltage corresponding with the charge stored on the capacitor having weight C may be $(Vmax-Vmin)/2^{10}$, where Vmax is equal to the maximum analog input voltage and Vmin is equal to the minimum analog input voltage.

Because the CDAC 110 is used to add or subtract voltages from analog input voltage Vin until the resulting voltage is approximately equal to the reference voltage Vref, and because the reference voltage Vref is substantially equal to half the difference between Vmax and Vmin, the maximum voltage to add to or subtract from the analog input voltage Vin is equal to the reference voltage Vref. Accordingly, the maximum voltage CDAC 110 is configured to add to or subtract from the analog input voltage Vin is equal to Vref.

Therefore, because the lsb voltage of the CDAC 110 is equal to the lsb voltage of the SAR ADC 100, and the maximum voltage CDAC 110 is configured to add to or subtract from the analog input voltage Vin is equal to Vref (half the difference between Vmax and Vmin), the CDAC 110 has one fewer bits than the SAR ADC 100.

The number of bits of the CDAC 110 plus the number of bits resolved by the comparator 120 is equal to the number of bits of the SAR ADC 100, or the number of bits of the CDAC 110 plus the number of bits resolved by the SAR ADC 100 without using the CDAC 110 search is equal to the number of bits of the SAR ADC 100.

For example, if the number of bits of the SAR ADC 100 is equal to 10, the CDAC 110 may have 9 bits, and 1 bit (the MSB) may be determined by the comparator 120 without using the CDAC 110 search.

Figure 3:
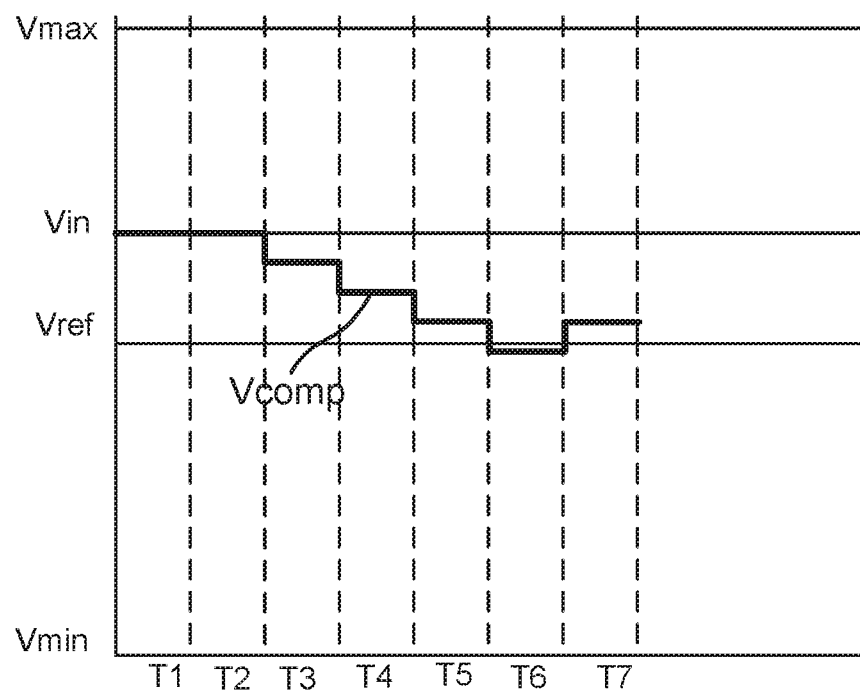
FIG. 3 is a waveform diagram illustrating operation of the SAR ADC of FIG. 1.

FIG. 3 is a waveform diagram illustrating operation of an embodiment of an SAR ADC, such as the SAR ADC 100 of FIG. 1. As shown, analog input voltage Vin is greater than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 3, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is greater than the reference voltage Vref. In addition, based on the comparison value, SAR logic 130 determines the MSB of the digital output, and determines that subsequent values of voltage Vcomp will be less than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In alternative embodiments, during time period T2, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. In addition, during time period T3, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T4, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. In addition, during time period T4, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. In addition, during time period T5, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T6, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. In addition, during time period T6, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 3, during the time period T7, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. The digital input word from SAR logic 130 for CDAC 110 of time period T7 corresponds with the voltage difference between the reference voltage Vref and analog input voltage Vin.

As a result of the voltage Vcomp being less than the voltage Vref during time period T6, the SAR logic 130 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 3, the maximum input voltage Vmax is 1 V, and the analog input voltage Vin is 0.74 V, a 4-bit digital word corresponding to the analog input voltage, may be 1011. The value of 1 for the MSB is determined during time period T1. In addition, because the digital input word from SAR logic 130 for 3-bit CDAC 110 of time period T6 causes the voltage Vcomp to be equal to or substantially equal to the analog input voltage Vin, minus four voltage steps, where the magnitude of the voltage steps is substantially equal to the voltage of 1 lsb of the SAR ADC 100, the other bits of the digital output word correspond with a voltage difference between the analog input voltage Vin and the reference voltage Vref, which corresponds digitally to 100. Accordingly, the digital output word is determined to be the expected 1011 because 0111+0100=1011, where 0111 represents the digitized value of the analog input voltage Vin minus four times the voltage of 1 lsb of the SAR ADC 100.

Once determined, the SAR ADC 100 represents the digital output word on the output Dout.

Figure 4:
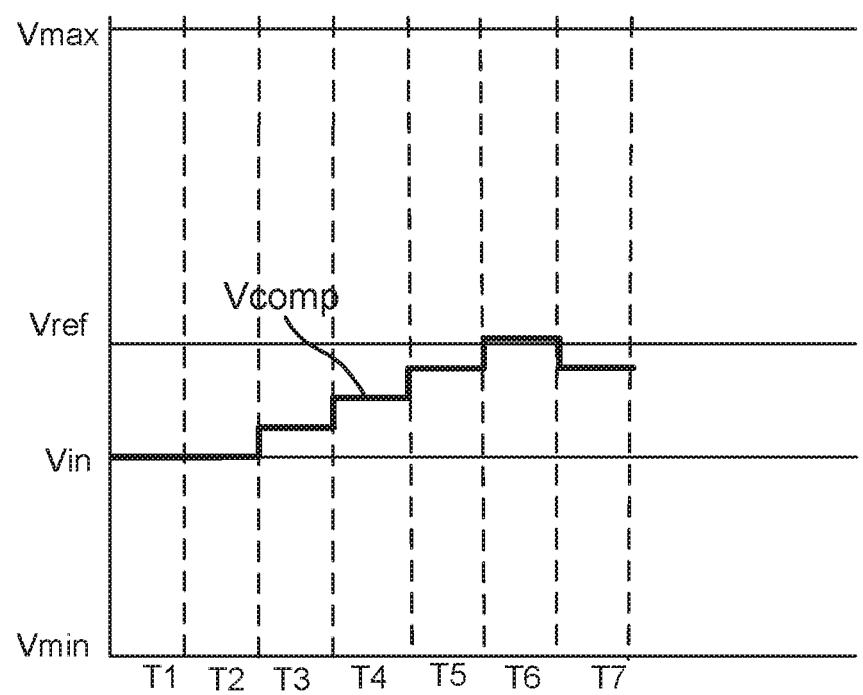
FIG. 4 is a waveform diagram illustrating operation of the SAR ADC of FIG. 1.

FIG. 4 is a waveform diagram illustrating operation of an embodiment of an SAR ADC, such as the SAR ADC 100 of FIG. 1. As shown, analog input voltage Vin is less than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 4, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is less than the reference voltage Vref. In addition, based on the comparison value, SAR logic 130 determines the MSB of the digital output, and determines that subsequent values of voltage Vcomp will be greater than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In alternative embodiments, during time period T2, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. In addition, during time period T3, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T4, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. In addition, during time period T4, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. In addition, during time period T5, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T6, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C, and which is substantially equal to the voltage of 1 lsb of the SAR ADC 100. In addition, during time period T6, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 4, during the time period T7, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C, and which is substantially equal to the voltage of 1 lsb of the SAR ADC 100. The digital input word from SAR logic 130 for CDAC 110 of time period T7 corresponds with the voltage difference between the reference voltage Vref and analog input voltage Vin.

As a result of the voltage Vcomp being greater than the voltage Vref during time period T6, the SAR logic 130 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 4, the maximum input voltage Vmax is 1 V, and the analog input voltage Vin is 0.26 V, a 4-bit digital word corresponding to the analog input voltage, may be 0100. The value of 0 for the MSB is determined during time period T1. In addition, because the digital input word from SAR logic 130 for 3-bit CDAC 110 of time period T6 causes the voltage Vcomp to be equal to or substantially equal to the analog input voltage Vin, plus four voltage steps, where the magnitude of the voltage steps is substantially equal to the voltage of 1 lsb of the SAR ADC 100, the other bits of the digital output word correspond with a voltage difference between the analog input voltage Vin and the reference voltage Vref, which corresponds digitally to 100. Accordingly, the digital output word is determined to be the expected 0100 because 1000−0100=0100, where 1000 represents the digitized value of the analog input voltage Vin plus four times the voltage of 1 lsb of the SAR ADC 100.

Once determined, the SAR ADC 100 represents the digital output word on the output Dout.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A successive approximation register (SAR) analog to digital converter (ADC), comprising:
   a DAC, configured to receive an analog input voltage at an input terminal and to receive a digital input word, and to generate a first voltage based on the analog input voltage and the digital input word;
   a comparator, configured to receive the first voltage and a reference voltage, and to generate a second voltage based on the first voltage and on the reference voltage, wherein the second voltage has a value corresponding with a sign of a difference between the first voltage and the reference voltage, wherein the DAC is configured to conditionally electrically connect the input terminal to the comparator such that the comparator receives the analog input voltage as the first voltage, and wherein the comparator is configured to generate the second voltage while receiving the first voltage; and an SAR logic circuit configured to receive the second voltage from the comparator, and to generate the digital input word for the DAC based on one or more second voltages received from the comparator, wherein the SAR logic circuit is further configured to generate a digital output word based on a plurality of second voltages received from the comparator, wherein the digital output word represents the value of the analog input voltage, wherein the most significant bit (MSB) of the digital output word is generated based on the second voltage from the comparator generated while the analog input voltage is the first voltage, and wherein the digital output word of the SAR logic circuit has a greater number of bits than the digital input word of the DAC.

2. The SAR ADC of claim 1, wherein the SAR logic is configured to determine the MSB of the digital output word by comparing the analog input voltage with the reference voltage, to determine a digital representation of a difference between the analog input voltage and the reference voltage, and to generate the bits of the digital output word other than the MSB based on the digital representation of the difference between the analog input voltage and the reference voltage.

3. The SAR ADC of claim 1, wherein the voltage corresponding with an lsb of the DAC is substantially equal to the voltage corresponding with an lsb of the SAR ADC.

4. The SAR ADC of claim 1, wherein the SAR logic is configured to determine whether the digital input word causes the DAC to generate the first voltage such that the first voltage is greater than or is less than the analog input voltage based on whether the analog input voltage is determined to be less than or greater than the reference voltage by the comparator.

5. The SAR ADC of claim 4, wherein the SAR logic is configured to generate the digital input word to cause the DAC to generate the first voltage such that the first voltage is greater than the analog input voltage in response to the analog input voltage being less than the reference voltage.

6. The SAR ADC of claim 4, wherein the SAR logic is configured to generate the digital input word to cause the DAC to generate the first voltage such that the first voltage is less than the analog input voltage in response to the analog input voltage being greater than the reference voltage.

7. The SAR ADC of claim 1, wherein the SAR logic is configured to determine a digital representation of a difference between the analog input voltage and the reference voltage.

8. The SAR ADC of claim 7, wherein the SAR logic is configured to determine the digital representation with a linear search.

9. The SAR ADC of claim 7, wherein the SAR logic is configured to determine the digital representation with a binary search.

10. The SAR ADC of claim 1, wherein the digital output word represents the value of the analog input voltage with reference to a range of analog values bounded by a minimum input voltage and a maximum input voltage, wherein a difference between the minimum input voltage on the maximum input voltage is substantially equal to two times a difference between the reference voltage and the minimum input voltage.

11. A method of determining a digital output word having a value corresponding with an analog input value with a successive approximation register (SAR) analog to digital converter (ADC), the method comprising:
with a DAC of the SAR ADC:
receiving an analog input voltage at an input terminal,
receiving a digital input word, and
generating a first voltage based on the analog input voltage and the digital input word;
with a comparator of the SAR ADC:
receiving the first voltage and a reference voltage,
generating a second voltage based on the first voltage and on the reference voltage, wherein the second voltage has a value corresponding with a sign of a difference between the first voltage and the reference voltage, and
generating the second voltage while receiving the first voltage;
with the DAC of the SAR ADC:
conditionally electrically connecting the input terminal to the comparator such that the comparator receives the analog input voltage as the first voltage; and
with an SAR logic circuit of the SAR ADC:
receiving the second voltage from the comparator,
generating the digital input word for the DAC based on one or more second voltages received from the comparator,
generating the digital output word based on a plurality of second voltages received from the comparator, and
generating the most significant bit (MSB) of the digital output word based on the second voltage from the comparator generated while the analog input voltage is the first voltage,
wherein the digital output word represents the value of the analog input voltage, and wherein the digital output word has a greater number of bits than the digital input word of the DAC.

12. The method of claim 11, further comprising, with the SAR logic, determining the MSB of the digital output word by comparing the analog input voltage with the reference voltage, determining a digital representation of a difference between the analog input voltage and the reference voltage, and generating the bits of the digital output word other than the MSB based on the digital representation of the difference between the analog input voltage and the reference voltage.

13. The method of claim 11, wherein the voltage corresponding with an lsb of the DAC is substantially equal to the voltage corresponding with an lsb of the SAR ADC.

14. The method of claim 13, further comprising, with the SAR logic, determining whether the digital input word causes the DAC to generate the first voltage such that the first voltage is greater than or is less than the analog input voltage based on whether the analog input voltage is determined to be less than or greater than the reference voltage by the comparator.

15. The method of claim 14, further comprising, with the SAR logic, generating the digital input word to cause the DAC to generate the first voltage such that the first voltage is greater than the analog input voltage in response to the analog input voltage being less than the reference voltage.

16. The method of claim 14, further comprising, with the SAR logic, generating the digital input word to cause the DAC to generate the first voltage such that the first voltage is less than the analog input voltage in response to the analog input voltage being greater than the reference voltage.

17. The method of claim 11, further comprising, with the SAR logic, determining a digital representation of a difference between the analog input voltage and the reference voltage.

18. The method of claim 17, further comprising, with the SAR logic, determining the digital representation with a linear search.

19. The method of claim 17, further comprising, with the SAR logic, determining the digital representation with a binary search.

20. The method of claim 11, wherein the digital output word represents the value of the analog input voltage with reference to a range of analog values bounded by a minimum input voltage and a maximum input voltage, wherein a difference between the minimum input voltage on the maximum input voltage is substantially equal to two times a difference between the reference voltage and the minimum input voltage.

* * * * *